United States Patent [19]
Tobe et al.

[11] Patent Number: 5,855,685
[45] Date of Patent: Jan. 5, 1999

[54] PLASMA ENHANCED CVD APPARATUS, PLASMA ENHANCED PROCESSING APPARATUS AND PLASMA ENHANCED CVD METHOD

[75] Inventors: Ryoki Tobe; Atsushi Sekiguchi; Masao Sasaki, all of Tokyo, Japan

[73] Assignee: Anelva Corporation, Fuchu, Japan

[21] Appl. No.: 720,866

[22] Filed: Oct. 3, 1996

[30] Foreign Application Priority Data

Oct. 9, 1995 [JP] Japan ..................................... 7-286342

[51] Int. Cl.$^6$ ....................................................... H05H 1/00
[52] U.S. Cl. .................... 118/723; 118/723 I; 118/723 E
[58] Field of Search ........................ 156/345; 118/723 E, 118/723 I, 723 IR

[56] References Cited

FOREIGN PATENT DOCUMENTS

| | | |
|---|---|---|
| 5-58072 | 8/1993 | Japan . |
| 6-35663 | 5/1994 | Japan . |
| 6-275600 | 9/1994 | Japan . |
| 7-18433 | 1/1995 | Japan . |
| 7-40468 | 5/1995 | Japan . |
| 7-254500 | 10/1995 | Japan . |

OTHER PUBLICATIONS

Observation of Ion Scattering from Metal Surfaces Bombarded with Low–Energy Hydrocarbon Ions; Yoshihito Mitsuoka et al; Jpn. J. Appl. Phys. vol. 34 (1995) pp. L516–L519; Apr. 1995.

8th Symposium On Plasma Science for Materials; Japan Society for the Promotion of Science, Committee 153 (Plasma Materials Science); p. 87; 1995.

Electrostatic Coupling of Antenna and the Shielding Effect in Inductive RF Plasmas; Hideo Sugai et al.; Jpn. J. Appl. Phys. vol. 33 (1994); pp. 2189–2193; Part 1, No. 4B, Apr. 1994.

RF Plasma Production at Ultralow Pressures with Surface Magnetic Confinement; Teruyuki Shirakawa et al.; Japanese Journal of Applied Physics; vol. 29, No. 6, Jun. 1990, pp. L1015–L1018.

*Primary Examiner*—Thi Dang
*Attorney, Agent, or Firm*—Burns, Doane, Swecker & Mathis, LLP

[57] ABSTRACT

By forming at least one annular groove in each of electrical insulation members provided between a plasma generating electrode and a processing chamber, the insulation performance of the electrical insulation members are prevented from degradation during deposition of conductive films onto a substrate. The plasma generating electrode is substantially a coil of one turn and provided with a pair of introduction portions passing through a wall of the processing chamber. An insulation ring made of quartz glass is installed between each of the introduction portion and the processing chamber. The insulation ring has a round through hole in the center of a disc and three concentric protrusions, each of which is in the shape of an annulus ring, are formed at one side of the disc (the side exposed in the processing chamber). Two annular grooves are made between the protrusions. Each of the protrusions are 50 mm high, 1 mm thick, and 1 mm wide.

27 Claims, 9 Drawing Sheets

PLASMA ENHANCED CVD APPARATUS, PLASMA ENHANCED PROCESSING APPARATUS AND PLASMA ENHANCED CVD METHOD

BACKGROUND OF THE INVENTION

1. Field of the Invention

The present invention relates to a plasma enhanced CVD apparatus equipped with a plasma generating electrode in a processing chamber, and further, relates to plasma enhanced CVD in which a conductive film is deposited by using the plasma enhanced CVD apparatus. Moreover, the present invention relates to a plasma processing apparatus equipped with a plasma generating electrode in a processing chamber.

2. Description of the Related Art

Plasma enhanced CVD is a method of depositing thin films on substrates by utilizing the chemical reaction of source gases. This method has been widely applied to depositing thin films, such as metallic films, semiconductor films, insulating films, photoconductive films, barrier films, and adhesion films, which films are used for semiconductor integrated circuits, superconductive devices, various kinds of electronic devices, and various kinds of sensors. In general, plasma generating electrodes are employed for generating plasma in processing chambers, and typically, radio-frequency powered electrodes are used. The systems of plasma generating electrodes are classified as a capacitively coupling system and an inductively coupling system. They can also be classified as an external electrode system in which an electrode is provided outside of the processing chamber and an internal electrode system in which an electrode is positioned inside of a processing chamber. Parallel-plate plasma enhanced CVD apparatuses according to the capacitively coupling system and the internal electrode system are most widely used among these. In addition, among plasma enhanced CVD apparatuses according the inductively coupling system and the external electrode system, apparatuses are frequently used that are provided with coiled electrodes winding around discharge chambers made of quartz glass. The present invention relates to a plasma enhanced CVD apparatus according to the internal electrode system, and further, the present invention relates to deposition of conductive films using this plasma enhanced CVD apparatus.

In a plasma enhanced CVD apparatus according to the internal electrode system, a plasma generating electrode, to which a radio frequency power is applied, is introduced into a processing chamber through a wall thereof. At each of the sites introducing the electrode, an electrical insulation member is inserted between the plasma generating electrode and the grounded metallic processing chamber so as to electrically insulate them.

The following problems appear when a conductive film is deposited on a substrate using the foregoing plasma enhanced CVD apparatus of the internal electrode system: If a conductive film adheres to the afore-mentioned electrical insulation members, the insulation performance thereof deteriorates, thus impairing stable plasma generation. Therefore, it is necessary to specially design the plasma generating electrode or surrounding structures thereof to prevent the conductive film from adhering to the electrical insulation members. In the case of a parallel-plate plasma enhanced CVD apparatus, plasma is generated between the parallel electrodes facing each other, therefore the conductive film does not easily adhere to the electrical insulation members arranged at the back sides of the parallel electrodes. Meanwhile, if an internal electrode (a coiled electrode) according to the inductively coupling system is used, plasma is generated around the plasma generating electrode, thus the electrical insulation member is readily exposed to the plasma and the conductive film easily adheres thereto.

Regarding these problems, Japanese Patent Publication No. 60-7937 discloses a technique, in which grooves are formed in electrical insulation members for avoiding degradation of insulation due to the conductive-film adhesion. This technique relates to an insulating spacer inserted between a pair of parallel electrodes facing each other in a processing chamber, in which a groove is formed in the insulating spacer to avoid degradation of insulation due to conductive-film adhesion.

Further, Japanese Patent Laid-Open No. 7-18433 discloses an apparatus for sputtering by using an internal electrode according to the inductively coupling system. Although this technique describes an insulation portion introducing the internal electrode into a vacuum chamber arranged in the dead zone of the chamber so as to prevent metallic films from depositing on the insulation portion, a practical shape or positioning of the insulation portion is not disclosed.

The foregoing problems are overcome if the conductive films are deposited according to the external electrode system. Other problems however may occur as follows: For example, when a coiled electrode winding around a discharge chamber made of quartz glass is used for generating plasma, conductive films are deposited on the inner walls of the discharge chamber. As a result, the conductive films shield the radio-frequency power applied to the coiled electrode. The plasma generated in the discharge chamber thereby becomes unstable, and further, in the worst case plasma generation per se becomes impossible. Therefore, frequent cleaning is required for the inner walls of the discharge chamber in the case of depositing conductive films on a substrate using a conventional plasma enhanced CVD apparatus according to the external electrode system.

An object of the present invention is to maintain stable plasma over a long period of time by avoiding a decrease in insulation performance between a plasma generating electrode and a processing chamber during deposition of conductive films on a substrate in a plasma enhanced CVD apparatus equipped with the plasma generating electrode in the processing chamber.

SUMMARY OF THE INVENTION

The present invention is characterized by electrical insulation members each of which is arranged between the corresponding introduction portion of a plasma generating electrode and a processing chamber in a plasma enhanced CVD apparatus provided with the plasma generating electrode in the processing chamber. Each of the electrical insulation members has a round through hole, through which the corresponding introduction portion of the plasma generating electrode can pass, and at least one annular groove formed on one surface exposed in the processing chamber and arranged surrounding the through hole. The opening of the annular groove may be positioned on a plane perpendicular to the axis of the through hole (that is, the depth direction of the annular groove is parallel to the axis of the through hole), or on a surface of a cylindrical face concentric with the through hole (that is, the depth direction of the annular groove is perpendicular to the axis of the through hole). Preferably, surface roughing is carried out on surfaces which are exposed in the processing chamber, of the electrical insulation members.

The width of the annular grooves is preferably in a range of from 0.01 mm to 3 mm, and preferably, from 0.3 mm to 2 mm. If the width exceeds the upper limit of the above range, plasma is allowed to readily enter into the grooves. As a result, conductive films are readily deposited onto the inside surfaces of the grooves during film-deposition onto a substrate using the plasma enhanced CVD apparatus. In other words, degradation is advanced in insulation performance of the insulation members. Meanwhile, if the groove width is smaller than the lower limit, contact easily occurs between the conductive films deposited on both sides of each groove edge, and also, cleaning of the groove becomes difficult.

The ratio of the groove depth to the groove width (the aspect ratio) is preferably maintained in a range of from 2 to 1,000, and more preferably, in a range of from 5 to 100. When the aspect ratio is smaller than the lower limit, the intermediates for a reaction gas are readily allowed to directly reach the groove bottoms, resulting in advance in degradation of insulation performance of the insulation members. Meanwhile, if the aspect ratio exceeds the upper limit, the groove depth increases substantially. The occupied space of the insulation members thus increases, and also, cleaning of the groove becomes difficult.

The present invention can be advantageously applied to a plasma generating electrode according to the internal electrode system and the inductively coupling system. A coiled electrode wound substantially one turn or a plurality of turns can be used as the plasma generating electrode. In this kind of a plasma generating electrode according to the inductively coupling system, one terminal of the electrode connects to a radio-frequency power supply. The other terminal is grounded through a ground connecting mechanism having at least one of a capacitor, a metal plate and a coil, or a combination of these utilizing a change-over system.

When conductive films are deposited by a plasma enhanced CVD apparatus of the present invention, the insulation performance of electrical insulation members does not readily deteriorate, which members are provided with grooves and used for electrically insulating a plasma generating electrode and a processing chamber. This is because the conductive films will not easily adhere to the inside surfaces of the grooves. That is, as compared with a case without grooves, the insulation performance does not significantly deteriorate and stable plasma can be maintained over a longer period of time. The advantages of the grooves are regarded as follows: When the groove width is considerably smaller than the mean free path of the gaseous molecules, plasma will not enter into the grooves, thereby the possibility of the conductive-film adhesion to the walls or bottoms of the grooves becomes extremely low. Although the mean free path of the gaseous molecules depends on the pressure and temperature of the processing chamber and the diameter of the molecules, the value is approximately a few mm, assuming that the practical pressure for the plasma enhanced CVD is around 1 Pa. Therefore, film adhesion can be quite effectively prevented if the groove width is arranged considerably smaller than the foregoing value of the mean free path. Further, with respect to the intermediates for a reaction gas directly entering the grooves, an advantageously smaller number of these reach the groove bottoms when the aspect ratio of the grooves increases. As a secondary effect of groove-forming, the insulation length along the surface of the electrical insulation members increases, which fact is further advantageous in preventing the degradation of the electrical insulation performance.

The present invention can be applied to plasma processing apparatuses in addition to the plasma enhanced CVD apparatus. Examples of the plasma processing apparatus are a sputtering apparatus, dry etching apparatus, plasma cleaning apparatus, and surface modification treatment apparatus (surface oxidation, surface nitriding).

DESCRIPTION OF THE PREFERRED EMBODIMENTS

Figure 1:
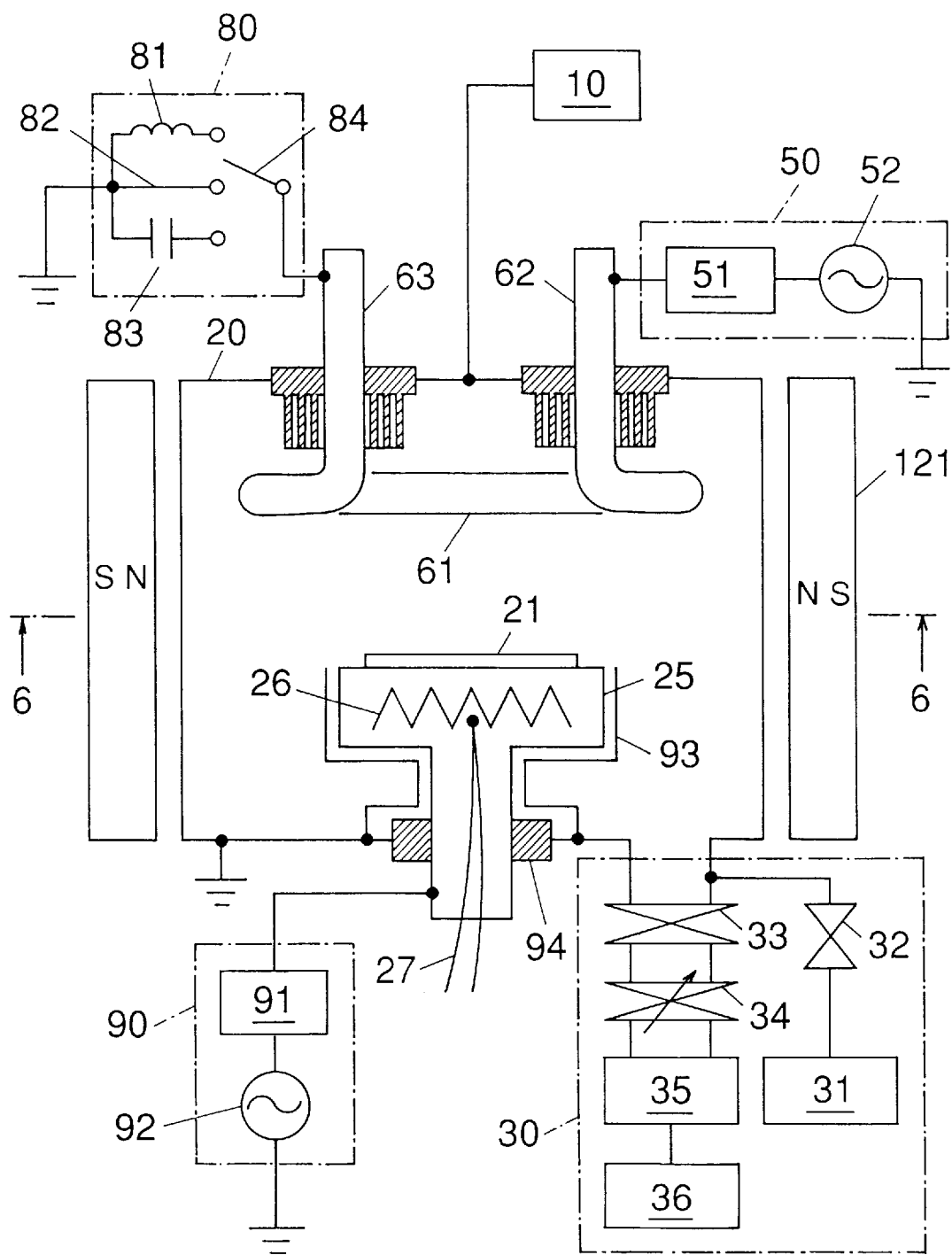
FIG. 1 is a diagrammatic view of an embodiment of a plasma enhanced CVD apparatus incorporated in the present invention.

FIG. 1 is a diagrammatic view of a plasma enhanced CVD apparatus of an embodiment incorporated in the present invention, wherein a cross-sectional view of a processing chamber is also shown. A substrate holder 25 and a plasma generating electrode 61 are placed inside of a processing chamber 20, which can be maintained under vacuum. A bias power supply 90 connects to the substrate holder 25. An electric power supply 50 and a ground connecting mechanism 80 connect to the plasma generating electrode 61. Further, a gas introduction mechanism 10 and an evacuation mechanism 30 connect to the processing chamber 20.

Figure 2:
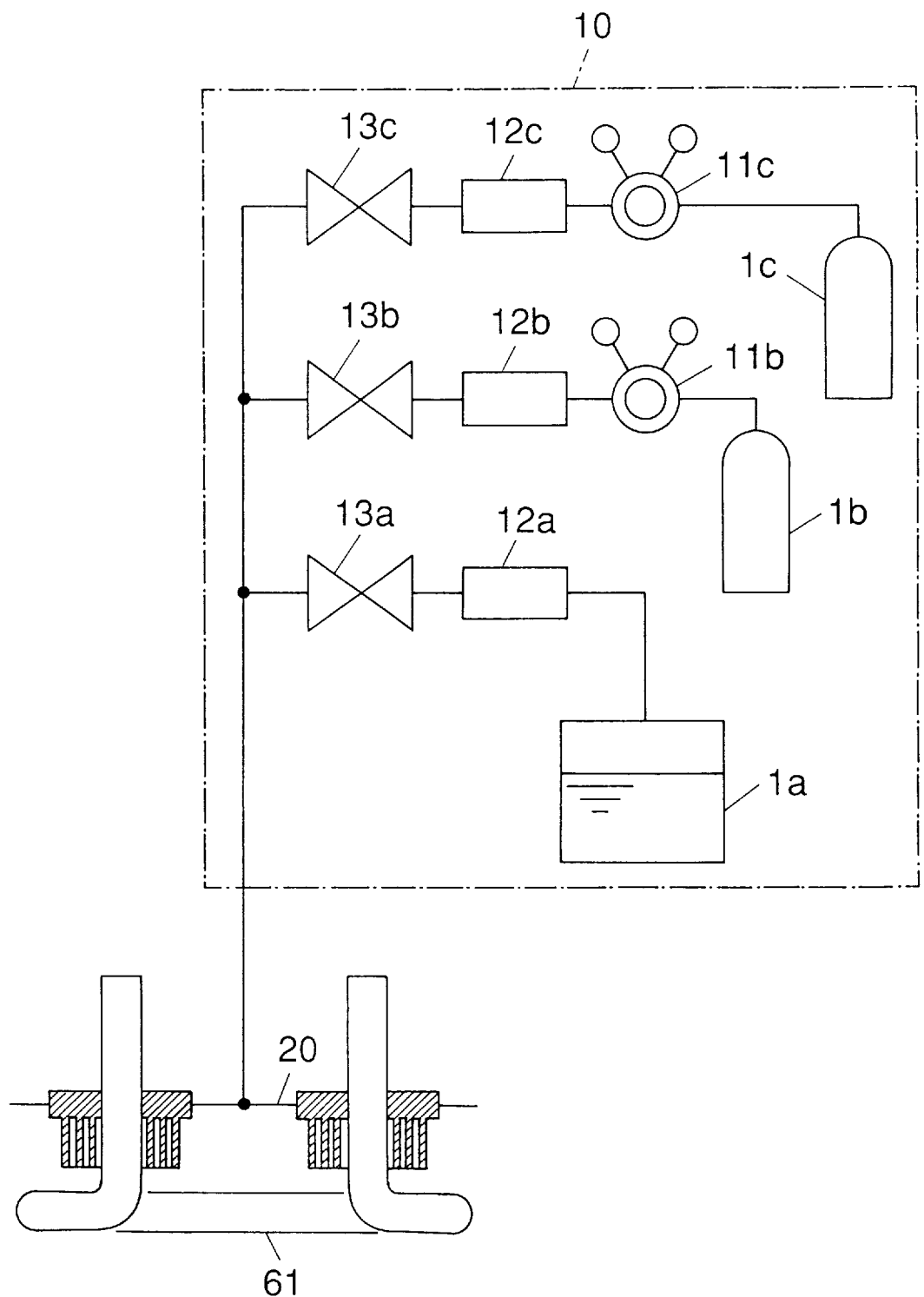
FIG. 2 is a diagrammatic view of a gas introduction mechanism.

First, the gas introduction mechanism 10 will be described below. FIG. 2 is a diagrammatic view of the gas introduction mechanism 10 capable of using three kinds of source gases. A source material container 1a is a thermostatic envelope which heats to a predetermined temperature such a source material that is in a liquid state at a normal temperature under normal pressure. The vaporized source material is introduced into the processing chamber 20 through a mass-flow controller 12a and a valve 13a. Source gases stored in corresponding source material containers 1b and 1c, both of which are compressed gas cylinders, are depressurized by corresponding pressure reducing valves 11b and 11c, controlled by corresponding mass-flow controllers 12b and 12c, and then, introduced into the processing chamber 20 by opening corresponding valves 13b and 13c. The outlet of the gas introduction mechanism 10 is located near the center of the plasma generating electrode 61. Although the valves 13a, 13b, and 13c are opened at the introduction of the source gases, they are closed so as to avoid gas contamination by the atmosphere when the processing chamber 20 is filled with the atmosphere.

Returning now to FIG. 1, the structure of the substrate holder 25 will be described. A substrate 21 is placed on the substrate holder 25, which is provided with a heater 26 and a thermocouple 27 therein. The temperature of the substrate holder 25 is measured by the thermocouple 27 to control the temperature of the substrate 21 by supplying electrical power to the heater 26 using a substrate temperature regulator, which is not shown in the figure. Although a PID controlling system is employed for this substrate temperature regulator, a fuzzy circuit may be used together if required, and other systems, such as a PI controlling system or an ON-OFF controlling system, may be used instead.

Next, the evacuation mechanism 30 will be explained. A roughing vacuum pump 31, which is an oil-sealed mechanical pump (at a pumping speed of 650 l/min), connects to the processing chamber via a roughing vacuum valve 32. In such a case that it is significantly important to keep the processing chamber 20 clean, an oil-free pump can be used as the roughing vacuum pump 31 or a dry pump may be employed for easier maintenance. A main pump 35, to which an auxiliary pump 36 connects in the subsequent stage, connects to the processing chamber 20 via a variable orifice 34 and a main valve 33. Although a complex turbo-molecular pump (at a pumping speed of 1,300 l/min) is used as the main pump 35, an oil diffusion pump can be employed if it is not significantly important to keep the processing chamber 20 clean. An oil-sealed mechanical pump is used as the auxiliary pump 36 (at a pumping speed of 1,180 l/min) and, similarly to the roughing vacuum pump 31, a dry pump may be employed.

First, the roughing vacuum valve 32 is opened to evacuate the processing chamber 20 by the roughing vacuum pump 31. After a first pressure is established in the processing chamber 20, the roughing vacuum valve 32 is closed and the main valve 33 is opened to evacuate the processing chamber to a further lower pressure range by the main pump 35. In this embodiment, the first pressure is set to approximately 100 Pa, though the value is variable depending on the evacuation system used. Based on the pressure of the processing chamber 20 measured by a vacuum gauge, it is possible to adjust the pressure to a desired value by opening or closing the variable orifice 34. The variable orifice 34 is advantageously used to obtain stable plasma with excellent reproducibility.

Figure 3:
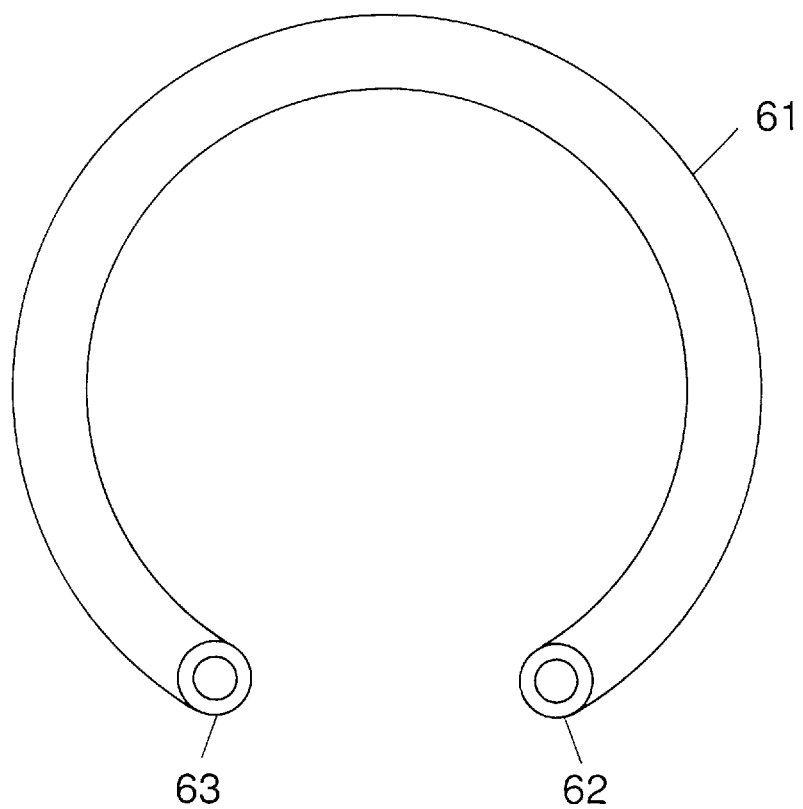
FIG. 3 is a plan view of a plasma generating electrode.

Next, the plasma generating apparatus will be described. The plasma generating apparatus is used for generating plasma in the processing chamber 20 and is provided with the electric power source 50, the plasma generating electrode 61 and the ground connecting mechanism 80. FIG. 3 is a plan view of the plasma generating electrode 61, which is substantially one-turn coil opposed to the substrate 21 and has a pair of introduction portions 62 and 63 passing through a wall of the processing chamber 20. The plasma generating electrode 61 is formed as an annulus ring of substantially one turn by bending a metallic pipe. The introduction portions 62 and 63 are formed perpendicular to the annulus-ring-shaped portion. The electrode can be cooled by passing cold water through the metallic pipe. However, air cooling is also available as occasion demands and cooling is not necessary in the case of a small applied power. According to this embodiment, a coil of one turn is employed for the plasma generating electrode 61, though a coil of two turns or three turns may be used instead. In addition, a helical electrode may be also used.

Returning now to FIG. 1, the introduction portion 62 of the plasma generating electrode 61 connects to a radio-frequency power supply 52 via an impedance-matching circuit 51, both of which compose the electric power supply 50. The frequency of the radio-frequency power supply 52 is 13.56 MHz and the rated power thereof is 3 kW. However, the frequency is not restricted to the foregoing value. The available frequency range is from 10 kHz to 600 MHz. When the frequency exceeds the upper limit, it becomes impossible to use a conductive material as a wiring. Whereas if the frequency is smaller than the lower limit, no electric wave can be transmitted. Furthermore, concerning the wave form, not only sine waves but also those which are obtained by modifying the sine waves in prescribed manners may be used. Although a H circuit is employed as the impedance-matching circuit 51, other kinds of circuits, for instance, a T circuit, may be used. The alternating electric power induced by the radio-frequency power supply 52 is provided for the plasma generating electrode 61 after impedance-controlling by the impedance-matching circuit 51.

Figure 4:
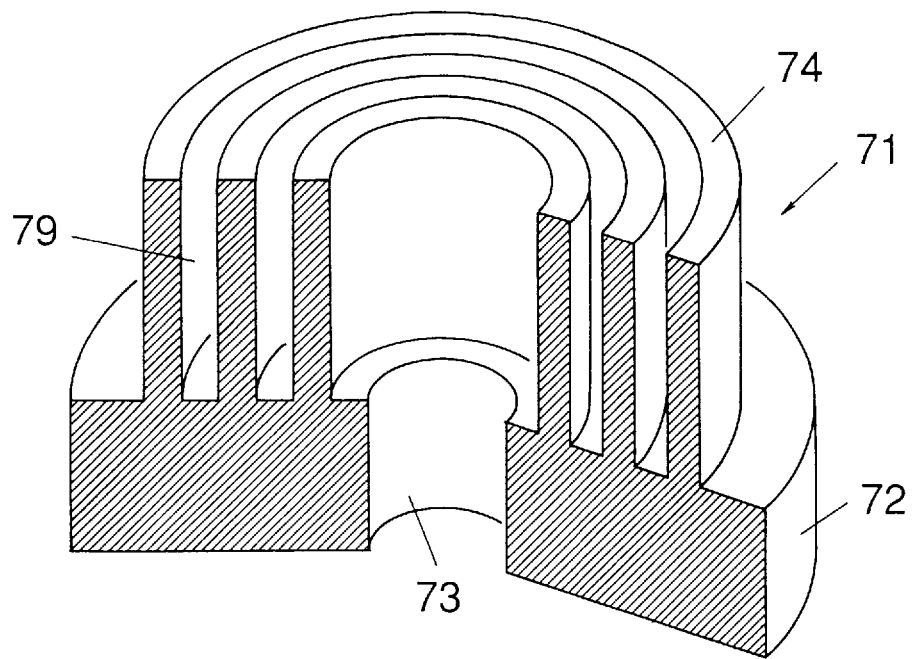
FIG. 4 is a sectional perspective view of an insulation ring.

Next, the mounting structure of the introduction portions 62 and 63 of the plasma generating electrode 61 will be explained. FIG. 4 is a sectional perspective view of an insulation ring 71 provided between each of the introduction portions of the plasma generating electrode 61 and the processing chamber 20. The insulation ring 71 is preferably made of quartz glass, which is an electrical insulation material. Each of the insulation rings 71 has a round through hole 73 formed in the center of a disc 72 and three concentric protrusions 74 of an annulus ring shape provided on one side of the disc 72 (the side exposed in the processing chamber). Two grooves 79 of an annulus ring shape are formed between the protrusions 74. The openings of the grooves 79 are positioned on a plane perpendicular to the axis of the through hole 73. That is, the depth direction of the grooves 79 is parallel to the axis of the through hole 73. Each of the protrusions 74 and the grooves 79 is concentric with the through hole 73. The cylindrical introduction portion 62 (see FIG. 1) of the plasma generating electrode 61 is inserted into the through hole 73. Since each of the three protrusions 74 of an annulus ring shape is 50 mm high and 1 mm thick, the depth of the grooves 79 becomes 50 mm. In addition, the aspect ratio of the grooves 79 is set to 50 because each width of the grooves (which means the distance between the adjacent protrusions 74) is 1 mm. The whole surface of the annulus-ring-shaped protrusions 74 and the surface of one side of the disc 72 exposed in the processing chamber 20 (the upper surface in FIG. 4) are subjected to blasting to obtain rough surfaces. it thereby becomes possible to prevent the adhered film from peeling from the insulation ring 71 so as to avoid contamination of the processing chamber 20 caused by dust generation due to peeling film. More precisely, in the insulation ring 71, there is a possibility of film adhesion to, for instance, the top surfaces of the protrusions 74, the exterior peripheral surface of the outermost protrusion 74, and the disk surface located further outer from the protrusion, except the inside surfaces of the grooves 79. If those surfaces have been treated with blasting, the adhered films will not be readily peeled therefrom.

Figure 5:
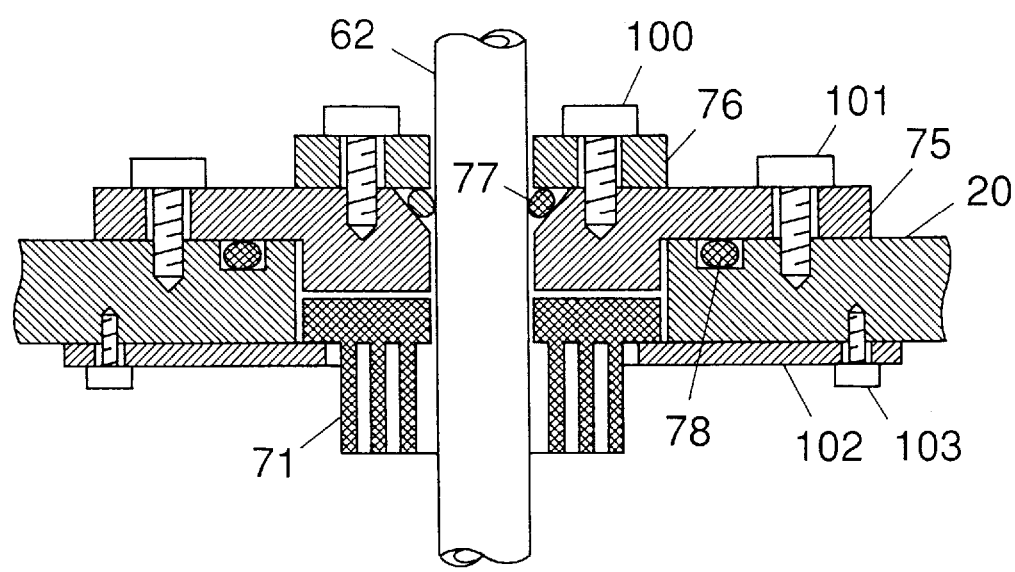
FIG. 5 is a front sectional view showing an assembled structure of a portion mounting the plasma generating electrode to a processing chamber.

FIG. 5 is a front sectional view showing an assembled structure of a portion mounting the plasma generating electrode 61 to the processing chamber 20. The introduction portion 62 of the plasma generating electrode 61 is fixed to the processing chamber 20 by means of the aforementioned insulation ring 71, an insulation collar 75 and an O ring keeper 76. The insulation collar 75 and the C ring keeper 76 are made of an electric insulation material, such as a polyamide resin, and have a through hole for the introduction portion 62. One edge of the inner wall of the insulation collar 75 is tapered so that an O ring 77 made of Viton is inserted thereto. The O ring 77 is positioned among the tapered portion of the inner wall of the insulation collar 75, the bottom face of the O ring keeper 76, and the exterior peripheral face of the introduction portion 62 so as to vacuum seal the space between the exterior peripheral face of the introduction portion 62 and the inner wall of the insulation collar 75. The top wall of the processing chamber 20 has a round through hole to which the step of the insulation collar 75 is inserted. An O ring 78 made of Viton is fitted to an annulus O ring groove provided on the upper face of the top wall of the processing chamber 20 and it vacuum-seals the space between the insulation collar 75 and the processing chamber 20. The O ring keeper 76 is fixed to the insulation collar 75 by screws 100 and the insulation collar 75 is fixed to the top wall of the processing chamber 20 by screws 101. The disc portion of the insulation ring 71 is held between the bottom face of the step of the insulation collar 75 and the upper face of a fitting 102. The fitting 102 is in the shape of a hollow disc and fixed to the bottom face of the upper wall of the processing chamber 20 by screws 103.

The other introduction portion 63 (see FIG. 1) of the plasma generating electrode 61 is mounted to the processing chamber 20 according to the same structure as shown in FIG. 5.

Figure 9:
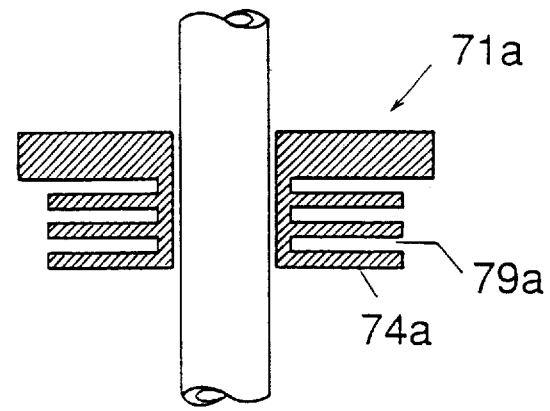
FIGS. 9(A)–9(C) are front sectional views showing modified examples of an insulation ring.
Figure 9:
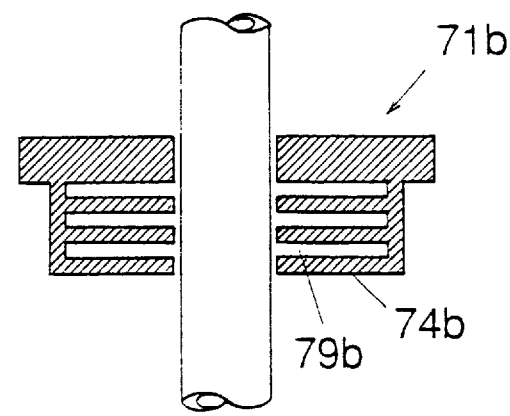
Figure 9:
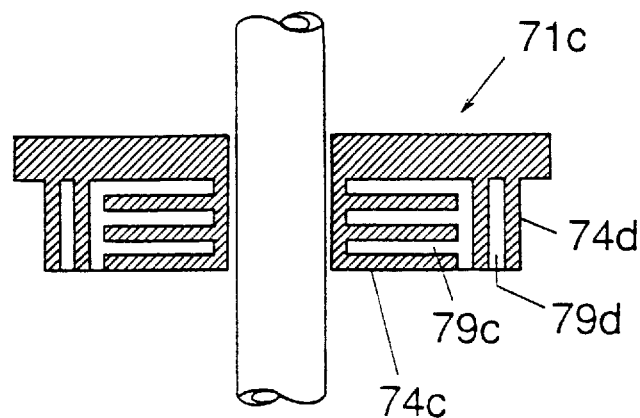

FIGS. 9(A)–9(C) illustrate modified examples of an insulation ring. An insulation ring 71a shown in FIG. 9(A) is prepared such that three hollow discs 74a are arranged parallel to one another along the axis of a through hole. The openings of grooves 79a formed between the hollow discs 74a are located on a cylindrical face concentric with the through hole. That is, the depth direction of the grooves 79a is perpendicular to the axis of the through hole.

Similar to FIG. 9(A), an insulation ring 71b shown in FIG. 9(B) is prepared such that three hollow discs 74b are arranged parallel to one another along the axis of a through hole. Grooves 79b, however, open toward the introduction portion 62. The openings of the grooves 79b are located on a cylindrical face concentric with the through hole. That is, the depth direction of the grooves 79b is perpendicular to the axis of the through hole.

An insulation ring 71c shown in FIG. 9(C) has the characteristics of the insulation rings shown in FIG. 9(A) and FIG. 4. In other words, three hollow discs 74c are arranged parallel to one another along the axis of a through hole, and in the outer portion thereof, two annulus protrusions 74d are formed. The insulation ring 71c is therefore provided with grooves 79c, of which openings are located on a cylindrical face concentric with the through hole, and grooves 79d, of which openings are located on a plane perpendicular to the axis of the through hole.

Returning now to FIG. 1, the ground connecting mechanism 80 will be described, which is installed between the introduction portion 63 of the plasma generating electrode 61 and a ground. The ground connecting mechanism 80 consists of a coil 81, a metal plate made of copper 82 and a capacitor 83, which are arranged in parallel. In each of these components, one terminal is grounded and the other terminal is allowed to be selectively connected with the introduction portion 63 using a switch 84. Typically, the switch 84 connects to the metal plate 82 so that one terminal of the plasma generating electrode 61 connects to the ground via the metal plate 82 through a direct-current flow. However, the connection through a direct-current flow between the plasma generating electrode 61 and the ground occasionally makes the plasma unstable. In such cases, the plasma generating electrode 61 is grounded through the capacitor 83. The flow of direct-current is thereby blocked and the flow of radio frequency current is permitted between one terminal of the plasma generating electrode 61 and the ground. Although the capacitor 83 incorporated in this embodiment is approximately 500 pF, the capacity thereof is not restricted to the foregoing value, and a range of from 200 to 1,200 pF is acceptable. Meanwhile, the stray capacitance between the plasma generating electrode 61 and the processing chamber 20 is approximately a few pF. A ceramic capacitor having excellent radio-frequency characteristics and which is voltage proof is preferably used as the capacitor 83. Further, if the plasma generating electrode 61 is made of a material which can be readily sputtered, it is also advantageous to ground the electrode via the coil 81 to prevent it from being sputtered. In other words, one terminal of the plasma generating electrode 61 is grounded via impedance through a radio-frequency flow.

Next, the mechanism of applying bias power to a substrate will be described. The substrate holder 25 connects to a radio-frequency power supply 92 for biasing via an impedance matching circuit 91. A bias power supply 90 consists of the impedance matching circuit 91 and the radio-frequency power supply 92 for biasing. The circuit constant of the impedance matching circuit 91 for biasing is different from that of the impedance matching circuit 51 for plasma generation. An alternating power induced by the radio-frequency power supply 92 for biasing is adjusted by the impedance matching circuit 91 and is supplied to the substrate holder 25 so as to control the bias voltage of the substrate 21. A shield plate 93 connected to the processing chamber 20 is installed surrounding the substrate holder 25. The substrate holder 25 is electrically insulated from the processing chamber 20 by an insulation body 94. It is preferable that the difference between the frequency of the radio-frequency power supply 92 for biasing and that of the radio-frequency power supply 52 for plasma generation is at least 500 Hz or more to avoid interaction between the power supplies so as to obtain a stable plasma. According to this embodiment, the frequency is set to 13.560 MHz for the radio-frequency power supply 52 for plasma generation and 13.562 MHz for the radio-frequency power supply 92 for biasing.

Figure 6:
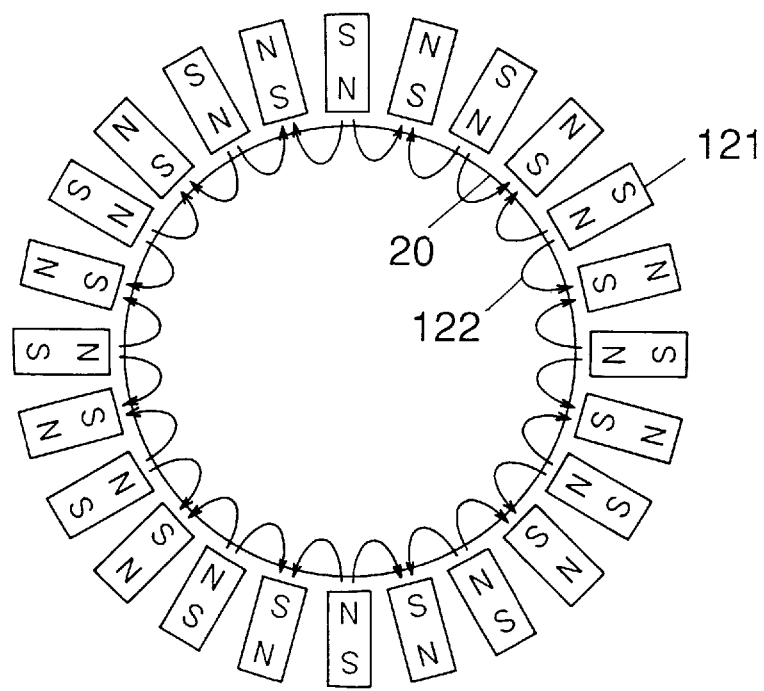
FIG. 6 is a horizontal sectional view of the processing chamber taken along line 6—6 in FIG. 1.

Next, the mechanism for generating a magnetic field will be described. A plurality of permanent magnets 121 of a vertically slender shape are arranged around the processing chamber 20. FIG. 6 is a horizontal sectional view of the processing chamber 20 taken along line 6—6 in FIG. 1. Twenty-four permanent magnets 121 are arranged around the processing chamber 20 at equal intervals such that the polarity of each of these magnets is opposite to others located adjacent thereto. In other words, the magnets 121 alternately face the N pole or S pole toward the center of the processing chamber 20. A multi-cusp magnetic field 122 is formed near the inner wall of the processing chamber 20 by the permanent magnets 121. The shape or number of the permanent magnets is not restricted to the above, and other constructions may be employed so long as the magnets alternately face the N pole or S pole toward the center of the processing chamber 20.

Due to the magnetic confinement, the multi-cusp magnetic field 122 prevents plasma from diffusing near the inner wall of the processing chamber 20, thus uniform plasma can be maintained at a high density. It is also possible to uniformly introduce a large current of ions over the surface of a large substrate.

Next, an example of thin film deposition using the plasma enhanced CVD apparatus will be described. A titanium nitride film was fabricated as follows: Titanium tetrachloride was employed as the first precursor in the source material container 1a, gaseous hydrogen was used as the second precursor in the source material container 1b, and gaseous nitrogen was employed as the third precursor in the source material container 1c, which containers 1a, 1b, and 1c are shown in FIG. 2. The flow rate was 20 ml/min for titanium tetrachloride, 200 ml/min for gaseous hydrogen, and 20 ml/min for gaseous nitrogen. The pressure of the processing chamber 20 was set to approximately 1 Pa and the temperature of the substrate 21 was set within the range of 450° C. to 600° C. The output of the radio-frequency power supply 52 was set to 3.0 kW. Under the foregoing conditions, a film essentially consisting of titanium nitride was deposited at a rate of approximately 60 nm/min. The specific resistance of the resultant film was 80 $\mu\Omega$cm. The apparatus according to the present invention was advantageous for fabricating conductive thin films made of titanium nitride or the like, since such phenomena as changes in the plasma with the passage of time or disappearance of plasma generation, which occurred in conventional apparatuses, were not observed in the above example.

Figure 7:
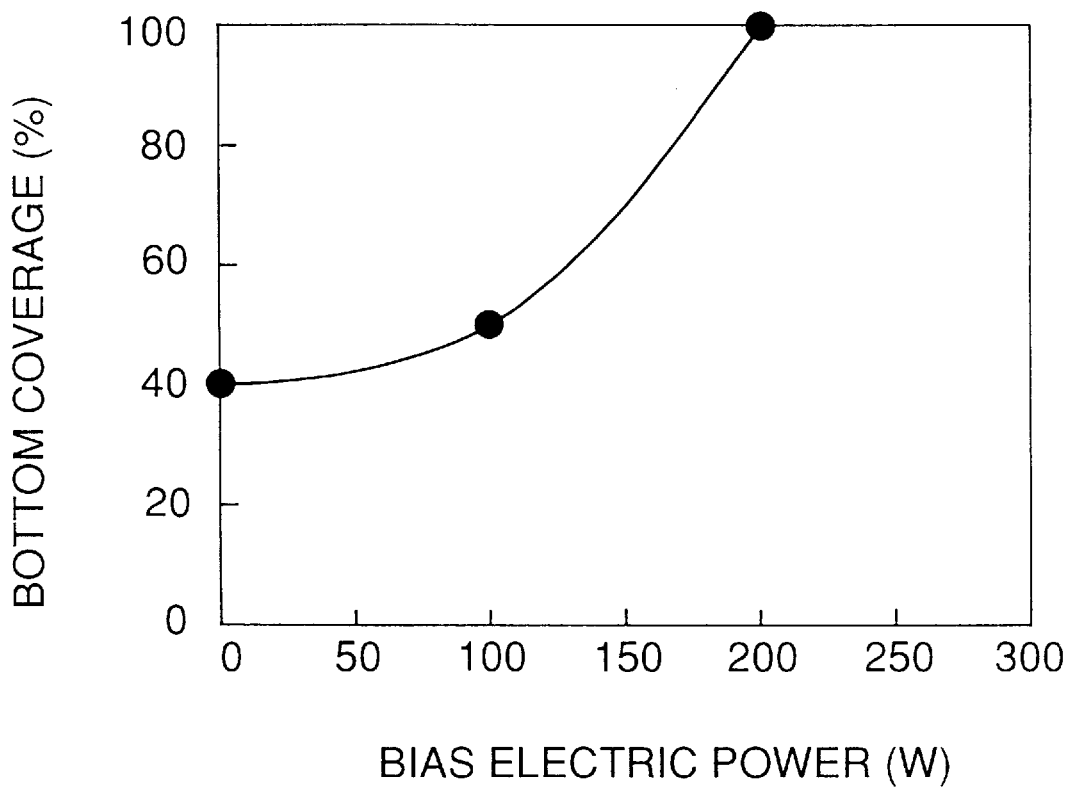
FIG. 7 is a graph showing the dependency of the bottom coverage on a power for biasing.

The titanium nitride thin film is, for instance, used for a barrier film in a contact portion of semiconductor integrated circuits. For this purpose, the film must be deposited in the bottom of a hole, of which the diameter is 0.35 $\mu$m or less and the depth is approximately 1.5 $\mu$m. FIG. 7 indicates the dependency of the bottom coverage ratio on the power for biasing obtained in this case. The bottom coverage ratio is defined as follows:

The bottom coverage ratio (%)=(b/a)×100 wherein a represents the film thickness of the flat portion and b represents the film thickness of the portion deposited on the bottom of the contact hole. It is understood from the graph that the bottom coverage ratio rapidly improves in relation to an increase in the power for biasing. This phenomenon occurs because the ions generated in the plasma perpendicularly impinge onto the substrate 21 due to the bias voltage thereof, resulting in an improvement in the bottom coverage ratio.

When a multi-cusp magnetic field is formed near the inner wall of the processing chamber, relatively uniform plasma can be maintained at the center of the processing chamber approximately 5 cm or more apart from the inner wall. The multi-cusp magnetic field formation is significantly advantageous in that it allows uniform film deposition onto a large substrate, i. e., uniformity in the film thickness distribution, the film characteristics distribution and the bottom coverage ratio. In particular, a further superior bottom coverage ratio with excellent uniformity can be obtained when the multi-cusp magnetic field formation is used with a bias power supply.

Next, another example of thin film deposition will be described. Titanium tetrachloride was employed as the first precursor, gaseous hydrogen was used as the second precursor, and gaseous argon was employed as the third precursor. The flow rate was 20 ml/min for titanium tetrachloride, 30 ml/min for gaseous hydrogen, and 35 ml/min for gaseous argon. The pressure of the processing chamber 20 was set to approximately 1 Pa and the temperature of the substrate 21 was set to 550° C. to 600° C. The output of the radio-frequency power supply 52 was set to 2.5 kW. Under the foregoing conditions, the composition of the deposited film differed depending on the material used for the under-layer. For instance, a metallic titanium thin film was deposited on a silicon oxide under-layer, and a titanium silicide (TiSi2) thin film was deposited on a silicon under-layer. It was revealed that the apparatus according to the present invention was advantageous for fabricating a reliable conductive thin film with good reproducibility, since such phenomena as changes in the plasma with the passage of time or disappearance of plasma generation, which occurred in conventional apparatuses, were not observed in the above example. The metallic titanium thin film and the titanium silicide thin film are, for instance, used for reducing contact resistance in a contact portion of semiconductor integrated circuits. In this case, a uniform thin film with an excellent bottom coverage ratio can be produced by the multi-cusp magnetic field and the bias power supply.

When the above metallic titanium thin film or a thin film containing titanium compound is fabricated, excellent film characteristics without impurities can be obtained by using a metallic titanium pipe as a plasma generating electrode. This is because titanium is not regarded as an impurity even if the plasma generating electrode is sputtered to some extent.

Next, an example of amorphous thin film deposition will be described. The source material containers 1a and 1c were not used and silane was employed as the precursor in source material container 1b. The flow rate of silane was 20 ml/min. The pressure of the processing chamber 20 was set to approximately 1 Pa and the temperature of the substrate 21 was set to 150° C. to 300° C. The output of the radio-frequency power supply 52 was set to 0.5 kW. Under the foregoing conditions, an amorphous film was deposited. Such phenomena as changes in the plasma with the passage of time or disappearance of plasma generation, which occurred in conventional apparatuses, were not observed in the above example.

Next, an example of silicon oxide thin film deposition will be described. The source material container 1a was not used, silane was employed as the source material in the source material container 1b, and gaseous oxygen was employed as the precursor in the source material container 1c. The flow rate of silane was 80 ml/min and that of the gaseous oxygen was 160 ml/min. The pressure of the processing chamber 20 was set to approximately 1 Pa and the temperature of the substrate 21 was set to 150° C. to 300° C. The output of the radio-frequency power supply 52 was set to 2.5 kW. Under the foregoing conditions, a silicon oxide thin film was deposited. A large radio-frequency window is not required for the apparatus of the present invention, which window has been necessary for apparatuses according to the external electrode system. Therefore, unexpected accidents caused by damage to the radio-frequency window are avoidable. In the above example, the silicon oxide film can be embedded in micro gaps between various kinds of wiring films on the substrate by, e.g., applying a bias power of 1.0 to 2.5 kW. Therefore, it is said that the apparatus of the present invention is also advantageous for fabricating inter-layer insulation films between various kinds of wiring films.

Figure 8:
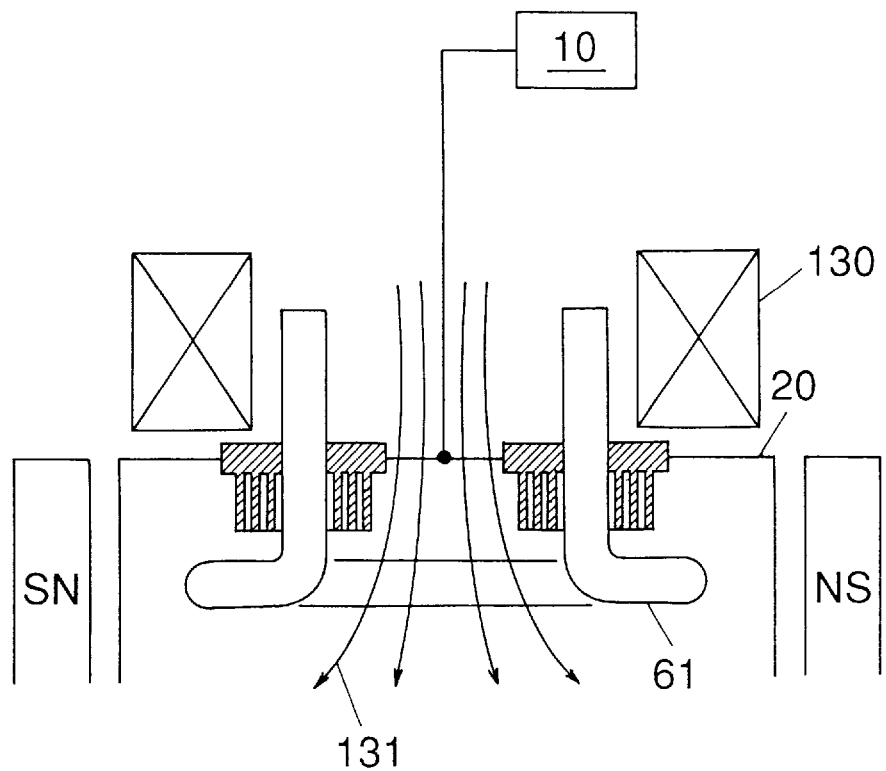
FIG. 8 shows a portion of a plasma enhanced CVD apparatus of another embodiment incorporated in the present invention.

FIG. 8 shows the principle part of a plasma enhanced CVD apparatus of another embodiment incorporated in the present invention. The construction of this embodiment is similar to that shown in FIG. 1, except that a solenoid coil 130 is arranged above the plasma generating electrode 61. Lines of magnetic force 131, produced by the solenoid coil 130, diverge after passing near the center of the plasma generating electrode 61 in the shape of a one-turn coil. The lines of magnetic force 131 allow plasma generation of a higher density to occur in the processing chamber 20. In addition, the apparatus of this embodiment enables easier discharge ignition. Similar to the apparatus shown in FIG. 1, a thin film made of titanium nitride, metallic titanium, titanium silicide, amorphous silicon, or silicon oxide can be fabricated using this apparatus.

According to the present invention, in each of the electrical insulation members 71 electrically insulating a plasma generating electrode and a processing chamber, annular grooves 79 are formed surrounding each of the introduction portions of the plasma generating electrode film. Film adhesion to the inside surfaces of the grooves can be thereby prevented during deposition of conductive films onto a substrate, resulting in a decrease in degradation of insulation performance. Therefore, stable plasma generation is attained over a long period of time.

Although only preferred embodiments are specifically illustrated and described herein, it will be appreciated that many modifications and variations of the present invention are possible in light of the above teachings and within the purview of the appended claims without departing from the spirit and intended scope of the invention.

What is claimed is:

1. A plasma enhanced CVD apparatus, comprising:
   a processing chamber;
   an evacuation mechanism for evacuating said processing chamber;
   a gas introduction mechanism for introducing a source gas into the processing chamber;
   a plasma generating electrode provided in said processing chamber, wherein a film is deposited onto a substrate in said processing chamber by generating plasma using power supplied to said plasma generating electrode;
   cylindrical introduction portions passing through a wall of said processing chamber; and
   electrical insulation members, each of which are arranged between a respective one of said introduction portions and said processing chamber;
   wherein each of said electrical insulation members comprises a round through-hole through which said respective introduction portion passes and at least one annular groove formed on a surface of the introduction member that is exposed in the processing chamber and arranged surrounding said through-hole.

2. A plasma enhanced CVD apparatus as set forth in claim 1, wherein an opening of said groove is located on a plane perpendicular to an axis of said through-hole and a depth direction of said annular groove is parallel to the axis of said through-hole.

3. A plasma enhanced CVD apparatus as set forth in claim 1, wherein an opening of said annular groove is located on a cylindrical face concentric with said through-hole and a depth direction of said annular groove is perpendicular to an axis of said through hole.

4. A plasma enhanced CVD apparatus as set forth in claim 2, wherein each of said insulation members includes a plurality of annular grooves.

5. A plasma enhanced CVD apparatus as set forth in claim 1, wherein each of said insulation members includes a plurality of annular grooves, and some openings of said annular grooves are located on a plane perpendicular to an axis of said through-hole and a remainder of the openings of said annular grooves are located on a cylindrical face concentric with said through-hole.

6. A plasma enhanced CVD apparatus as set forth in claim 1, wherein a surface of each of said electrical insulation members that is exposed in said processing chamber is rough.

7. A plasma enhanced CVD apparatus as set forth in claim 1, wherein a width of said groove is in a range of 0.01 mm to 3 mm.

8. A plasma enhanced CVD apparatus as set forth in claim 1, wherein a width of said groove is in a range of 0.3 mm to 2 mm.

9. A plasma enhanced CVD apparatus as set forth in claim 1, wherein a ratio of depth to width of said annular groove is in a range of 2 to 1,000.

10. A plasma enhanced CVD apparatus as set forth in claim 1, wherein a ratio of depth to width of said annular groove is in a range of 5 to 100.

11. A plasma enhanced CVD apparatus as set forth in claim 1, wherein said plasma generating electrode is a coil comprising substantially one-turn.

12. A plasma enhanced CVD apparatus as set forth in claim 1, wherein said plasma generating electrode is a coil comprising more than one turn.

13. A plasma enhanced CVD apparatus as set forth in claim 1, wherein the introduction portions form part of said plasma generating electrode, one of said introduction portions is connected to a radio-frequency power supply and another of the introduction portions is grounded via a ground connecting mechanism.

14. A plasma enhanced CVD apparatus as set forth in claim 13, wherein said ground connecting mechanism comprises at least one of a capacitor connecting said plasma generating electrode to ground, a metal plate connecting said plasma generating electrode to ground, and a coil connecting said plasma generating electrode to ground.

15. A plasma enhanced CVD apparatus as set forth in claim 13, wherein said ground connecting mechanism comprises at least two of a capacitor capable of connecting said plasma generating electrode to ground, a metal plate capable of connecting said plasma generating electrode to ground, and a coil capable of connecting said plasma generating electrode to ground, which are selectively switched.

16. A plasma processing CVD apparatus, comprising:
   a processing chamber;
   an evacuation mechanism for vacuuming said processing chamber;
   a gas introduction mechanism for introducing a source gas into the processing chamber;
   a plasma generating electrode provided in said processing chamber, wherein a film is deposited onto a substrate in said processing chamber by generating plasma using power supplied to said plasma generating electrode;
   cylindrical introduction portions passing through a wall of said processing chamber; and
   electrical insulation members, each of which are arranged between a respective one of said introduction portions and said processing chamber;
   wherein each of said electrical insulation members comprises a round through-hole through which said corresponding introduction portion passes and at least one annular groove formed on a surface of the introduction member that is exposed to the processing chamber and arranged surrounding said through-hole.

17. An insulator for a CVD apparatus, comprising:
   a body formed of an insulating material, said body including a face for securing the insulator to a wall of a processing chamber of said CVD apparatus;
   a through-hole extending through a center of said body so that the through-hole extends through the wall of the processing chamber when the body is secured to the wall; and
   a pair of parallel plates arranged concentrically around said through-hole so as to create a groove between said parallel plates, said groove being exposed to an interior portion of the processing chamber when the body is secured to the wall.

18. The insulator of claim 17, wherein the through-hole extends substantially perpendicular to the wall of the processing chamber when the body is secured to the wall.

19. The insulator of claim 17, wherein the parallel plates extend in a direction parallel to the through-hole.

20. The insulator of claim 17, wherein the parallel plates extend in a direction perpendicular to the through-hole.

21. The insulator of claim 17, wherein the parallel plates extend in a direction parallel to the through-hole, and further comprising a second pair of parallel plates that extend perpendicular to the through-hole.

22. The insulator of claim 17, further comprising a third plate parallel to the pair of plates.

23. A plasma enhanced CVD method, comprising steps of:

introducing a source gas into a processing chamber;

generating plasma by supplying electric power to a plasma generating electrode provided in said processing chamber; and depositing a conductive film onto a substrate in said processing chamber;

wherein said plasma generating electrode comprises cylindrical introduction portions passing through a wall of said processing chamber; electrical insulation members are arranged between a respective one of said introduction portions and said processing chamber; and each of said electrical insulation members comprises a round through-hole through which said respective introduction portion passes and at least one annular groove formed on a surface exposed in said processing chamber and arranged surrounding said through hole.

24. A plasma enhanced CVD method as set forth in claim 23, wherein a titanium nitride film is deposited onto the substrate by using titanium tetrachloride, gaseous nitrogen and gaseous hydrogen as said source gases.

25. A plasma enhanced CVD method as set forth in claim 23, wherein a titanium film is deposited onto the substrate by using titanium tetrachloride and gaseous hydrogen as said source gases.

26. A plasma enhanced CVD method as set forth in claim 23, wherein a titanium silicide film is deposited onto the substrate by using titanium tetrachloride and gaseous hydrogen as said source gases and by using silicon as said substrate.

27. A plasma enhanced CVD method as set forth in claim 24, wherein titanium is used as a material for said plasma generating electrode.

* * * * *